United States Patent
Leu (10) Patent No.: US 8,095,895 B2
(45) Date of Patent: Jan. 10, 2012

(54) METHOD FOR DEFECT DIAGNOSIS AND MANAGEMENT

(76) Inventor: Iyun Leu, Hsinchu (TW)

( * ) Notice: Subject to any disclaimer, the term of this patent is extended or adjusted under 35 U.S.C. 154(b) by 416 days.

(21) Appl. No.: 12/318,974

(22) Filed: Jan. 14, 2009

(65) Prior Publication Data

US 2010/0180239 A1   Jul. 15, 2010

(51) Int. Cl.
*G06F 17/50* (2006.01)
(52) U.S. Cl. ............... 716/52; 716/56; 430/5; 700/110; 700/121
(58) Field of Classification Search ............ 716/52, 716/56; 430/5; 700/110, 121
See application file for complete search history.

(56) References Cited

U.S. PATENT DOCUMENTS

| | | | | |
|---|---|---|---|---|
| 5,210,704 A | * | 5/1993 | Husseiny | 702/34 |
| 5,963,315 A | * | 10/1999 | Hiatt et al. | 356/237.3 |
| 6,433,561 B1 | * | 8/2002 | Satya et al. | 356/237.5 |
| 6,823,496 B2 | * | 11/2004 | Bergman Reuter et al. | 716/52 |
| 7,089,077 B1 | * | 8/2006 | Reitmeyer et al. | 700/121 |
| 7,403,832 B2 | * | 7/2008 | Schulze et al. | 700/110 |
| 2002/0095348 A1 | * | 7/2002 | Hiroshige et al. | 705/26 |
| 2004/0030610 A1 | * | 2/2004 | Mimura | 705/26 |
| 2007/0226075 A1 | * | 9/2007 | Hiroshige et al. | 705/26 |
| 2007/0288219 A1 | * | 12/2007 | Zafar et al. | 703/14 |
| 2010/0004882 A1 | * | 1/2010 | Chu et al. | 702/58 |
| 2010/0169713 A1 | * | 7/2010 | Argue et al. | 714/25 |

* cited by examiner

*Primary Examiner* — Naum Levin
(74) *Attorney, Agent, or Firm* — Rosenberg, Klein & Lee (57) ABSTRACT

A method for defect diagnosis and management, which is implemented in a process for fabricating an article, comprising the following steps: obtaining an inspection image of the article, wherein the inspection image shows at least one defect of the article; retrieving a design layout corresponding to the inspection image, wherein the design layout has a plurality of conductive regions; matching the inspection image and the design layout for correcting the coordinates of the defect on the design layout; and judging the overlaps of the conductive regions so as to obtain a short failure if the defect covers two conductive regions, obtain a open failure if the defect intercepts one of conductive region, or obtain no failure if the defect overlaps one of conductive region but not intercepts or covers another conductive region.

13 Claims, 7 Drawing Sheets

METHOD FOR DEFECT DIAGNOSIS AND MANAGEMENT

BACKGROUND OF THE INVENTION

1. Field of the Invention

The present invention is related to a method for defect diagnosis and management; in particular, to a method of diagnosing and managing defects of an article within a fabrication process.

2. Description of Related Art

The fabrication process for semiconductors, PC circuit boards, masks, flat panel displays, or solar cells includes film deposition, masking, photo lithography, etching, etc. During the fabrication process, the generated defects may be random defects or systematic defects. Those defects come from different sources, ex. equipment malfunction, facility leak, impurities of environment, design layout weak spot or the like.

Some defects will result in yield reduction of the fabrication process, and these defects are so-called "killing defects". Killing defects will cause the semiconductor, or PC circuit board, etc. to have an open failure if, for example, the defect affects a conductive line of the semiconductor, or to have a short failure if the defect affects the space between conductive lines. Killing defects will eventually generate bad dies in the semiconductor, bad single boards in PC circuit board, etc. When killing defects are occurring frequently, yield will be reduced, and costs of the fabrication process will increase. Therefore, it is important to manage defects in real-time when they occur, and further diagnose impacts to the equipment of the process, or identify the weak design spot.

To deal with defects, a defect scan and inspection tool is commonly used to monitor defects during the fabrication process. The defect scan and inspection tool is heavily utilized in day-to-day operation. Reviewing the data of the defect from the defect scan and inspection tool is heavily relying on human power, but it is not efficient whether used in semiconductor fabrication, PC circuit board industry, or the like. Since viewing the data of the defect by humans is slow and lengthy, only a few percentages of the data of the defect are sent to engineers for reviewing daily. Therefore, potential killing defects are easily ignored.

Moreover, potentially malfunctioning equipment will be reviewed only if the data of the defect is reviewed by the engineer. Otherwise, the malfunctioning equipment is bypassed without defect reviewing. Large yield reduction will eventually occur with a long period of malfunction.

Accordingly, the inventors of the present invention have considered the aforementioned disadvantages and proposed the present invention of reasonable design which is able to effectively improve the disadvantages.

SUMMARY OF THE INVENTION

The major objective of the present invention is to provide a method for defect diagnosis and management, which is capable of diagnosing and managing the defects of an article during fabrication process, and integrating with the maintenance of equipment, improvement of process, and design of experiment analysis, etc.

To achieve the above-mentioned objective, the present invention provides a method for defect diagnosis and management, which is implemented in a process for fabricating an article, comprising the following steps: obtaining an inspection image of the article from a inspection tool, wherein the inspection image shows at least one defect of the article; retrieving a design layout corresponding to the inspection image from a design database, wherein the design layout has a plurality of conductive regions; matching the inspection image and the design layout for correcting the coordinates of the defect on the design layout from the inspection tool; and determining the overlaps of the conductive regions so as to obtain a short failure from the inspection tool if the defect covers two conductive regions, obtain a open failure from the inspection tool if the defect intercepts one of conductive region, or obtain no failure from the inspection tool if the defect overlaps one of conductive region but not intercepts or covers another conductive region.

The present invention provides the following benefits:
1. The inspection image is generated from a defect scan and inspection tool which fail to provide a correct location of the defect on the design layout, thereby forms an inconsistent offset from accurate location on the design layout. This method of the invention corrects the inconsistent offset by matching the inspection image and the design layout, so that the accurate coordinates of the defect on the design layout can be found, the defect can be judged as an open failure, a short failure, or no failure.
2. The defect of the inspection image is reviewed automatically by a machine, system, or computer, so that the defect judgment can be achieved in a small period of time. Accordingly, every defect generated in the process can be reviewed and judged, which ensures no potential failure of the article will be ignored.
3. The method of the invention further integrates the data of the defect with the maintenance of equipment, improvement of process, and design of experiment analysis.

DETAILED DESCRIPTION OF PREFERRED EMBODIMENTS

The present invention discloses a method for defect diagnosis and management. The method can be implemented in a process for fabricating an article, such as semiconductor, PC circuit board, mask, flat panel display, and solar cell, where the process generally includes film deposition, photo lithography, and etching etc. In a preferable embodiment, the article is a semiconductor, i.e. wafer. The method of the invention is performed in a device, system, or computer, which will automatically run the workflow of the method, instead of manually.

Figure 1:
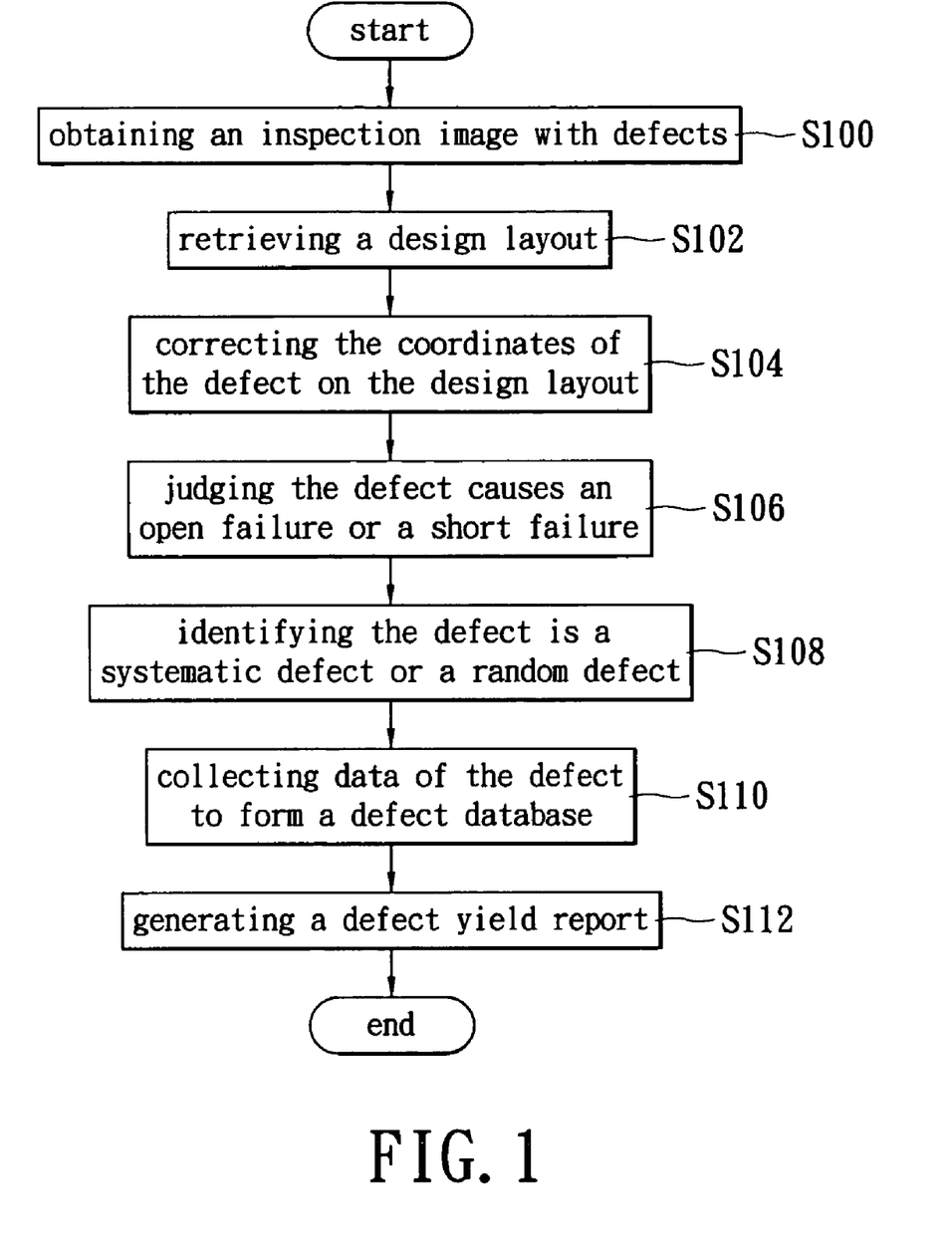
FIG. 1 is a flowchart of the method for defect diagnosis and management according to the present invention.

Please referring to FIG. 1, the detailed workflow of the method of the first embodiment is set out as below:

Firstly, when the process for fabricating the wafer is performed, a defect scan and inspection tool will measure whether the defects occurred of the wafer within or after the process. Please refer to the FIG. 2, the defect scan and inspection tool will generate a plurality of inspection images 10 when it has scanned the defects. Taking one of the inspection images 10 for instance, it shows three defects 11, 12, and 13 and some fabricated patterns 14 of the wafer. The defects 11, 12, and 13 each may be a random defect or a systematic defect. A random defect comes from the adhesion of a foreign particle to the wafer, whereas a systematic defect comes from unexpected varying sizes of the fabricated patterns 14. The defect scan and inspection tool also measures the locations of the defects 11, 12, and 13, giving the coordinates of the defects 11, 12, and 13, but not accurate. (Step S100).

Figure 3:
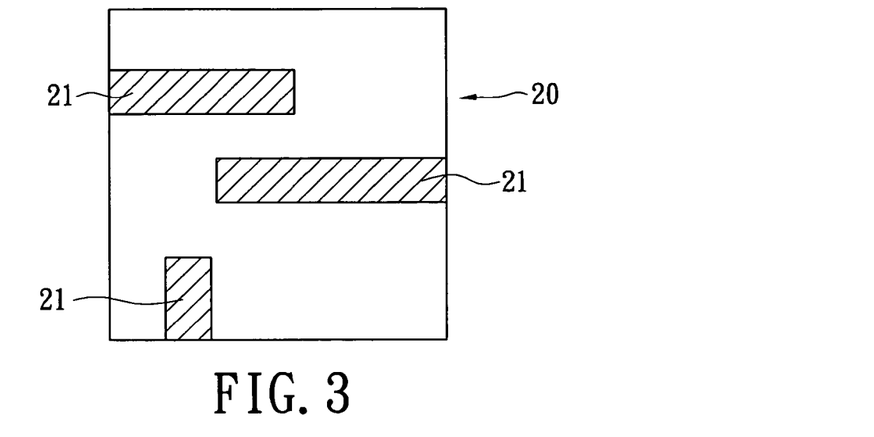
FIG. 3 is a schematic view showing a design layout of the method for defect diagnosis and management according to the present invention.

Then, please refer to FIG. 3, a design layout 20 corresponding to the inspection image 10 is retrieved from the design database. The design layout 20 shows a plurality of conductive regions 21 which the fabricated patterns 14 are aimed to be fabricated the same. (Step S102).

Figure 2:
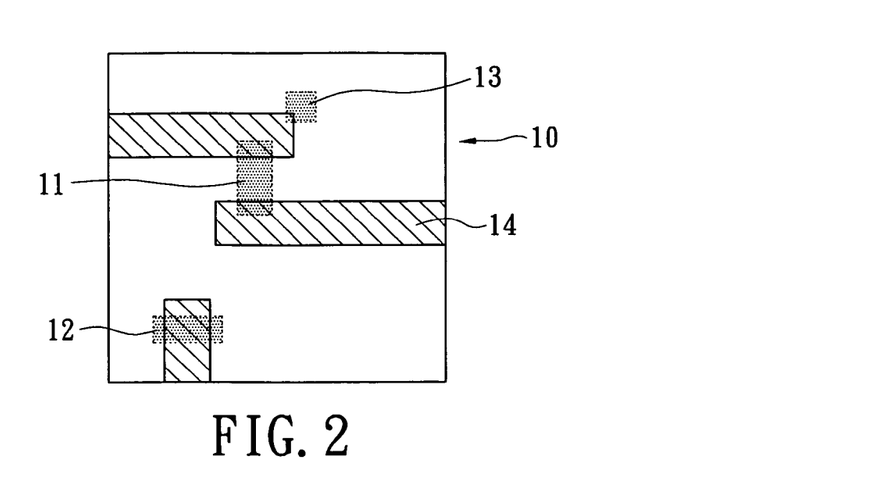
FIG. 2 is a schematic view showing an inspection image of the method for defect diagnosis and management according to the present invention.

Next, the inspection image 10 and the design layout 20 will be matched for correcting the coordinates of the defects 11, 12, and 13 on the design layout 20. Although the defect scan and inspection tool has measured the coordinates of the defects 11, 12, and 13, those are not accurate. Thus, it is meaningless to use the wrong coordinates to locate the defects 11, 12, and 13 on the design layout 20 and to diagnose the defects 11, 12, and 13. Therefore, the wrong coordinates of the defects 11, 12, and 13 need to be corrected.

Figure 4:
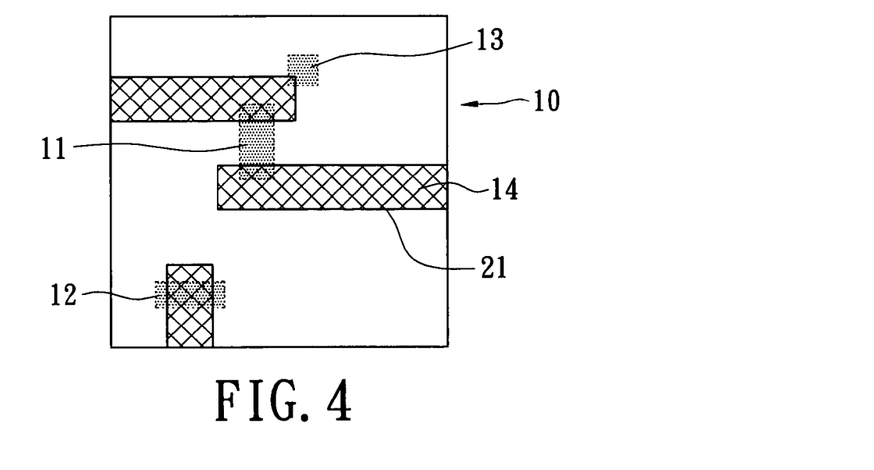
FIG. 4 is a schematic view showing overlaps between the design layout and the inspection image of the method for defect diagnosis and management according to the present invention.

Please refer to the FIG. 4, to solve the above mentioned issue, the boundaries of the fabricated patterns 14 of the inspection image 10 are aligned with those of the conductive regions 21 of the design layout 20, thereby the accurate coordinates of the defects 11, 12, and 13 on the design layout 20 can be found. (Step S104).

Finally, the defects 11, 12, and 13 will be judged as to whether they are likely to cause an open failure or a short failure by determining their overlaps to the conductive regions 21. For example, the defect 11 covers two of the conductive regions 21, and thus will cause a short failure to the wafer. The defect 12 intercepts one of the conductive regions 21, and thus will cause an open failure to the wafer. The defect 13 overlaps one of the conductive regions 21, but does not intercept or cover other conductive regions 21. Thus it will cause no failure. (Step S106). The defects 11, 12, or 13 will be also judged as to whether they are systematic defects or random defects. (Step S108).

The steps S100 to S108 can be executed in a small period of time. Accordingly, every inspection image 10 of the process can be reviewed, and defects 11, 12, and 13 shown in the inspection image 10 can be diagnosed, thereby ensuring no potential failure of the wafer will be ignored.

After every defect 11, 12, or 13 is diagnosed, the data of the defect will be collected to form a defect database. The data of the defect includes coordinates, type of defect, type of failure, corresponding equipment, and corresponding design layout 20, etc. (Step S110). The collected data of the defect can be generated as a defect yield report for engineers examining and utilizing. (Step S112).

When the method of the invention has been performed in more inspection images 10, the defect database will include more data of the defect, and be more comprehensive. The defect database may be taken into consideration in combination to the maintenance of equipment, improvement of the process, and design of experiment, etc.

Figure 5:
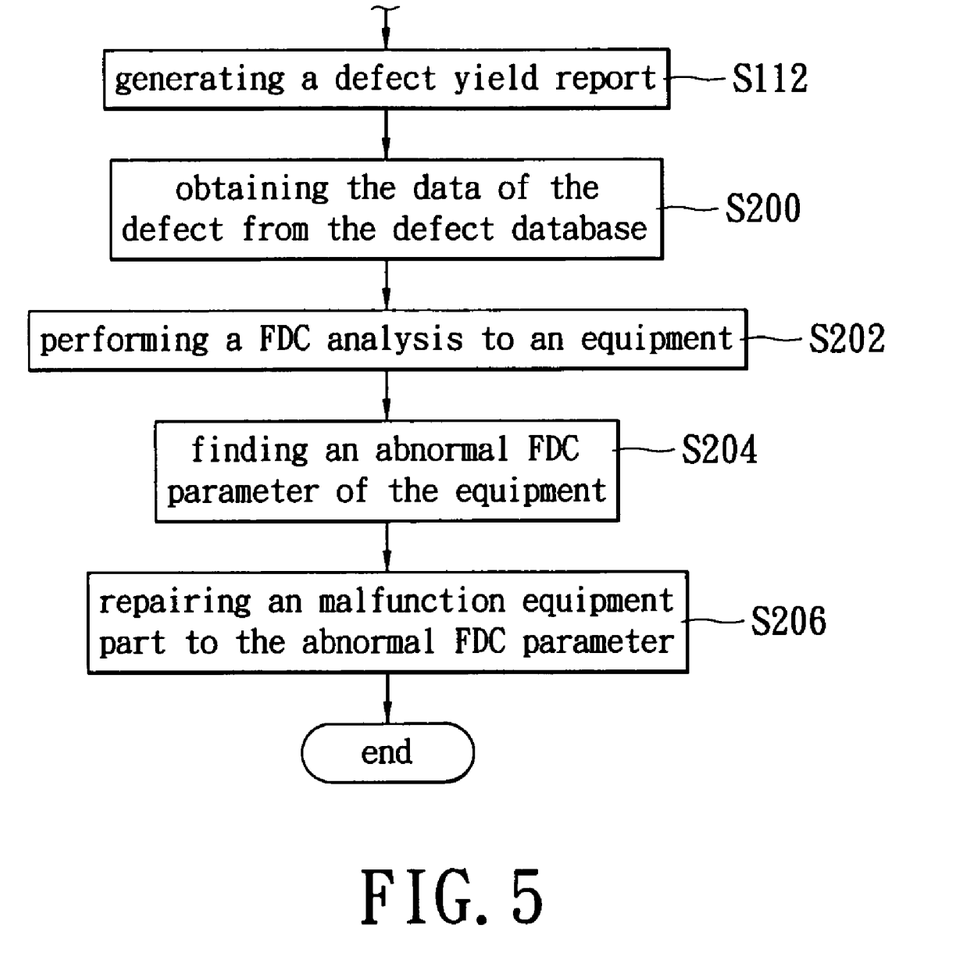
FIG. 5 is a flowchart of a second embodiment of the method for defect diagnosis and management according to the present invention.

Please refer to FIG. 5; the method of this invention has a second embodiment, which integrates with the maintenance of equipment of the process. The detailed workflow of the method is set out as below, which is continued after Step S112.

Firstly, the data of the defect from the defect database established in the step S110 will be obtained for further utilizing in the following steps. The data of the defect is then analyzed to see whether the equipment is prone to be maintained. This analysis follows at least three criteria: 1) Defect yield of the equipment is out of specified or controlled limit. 2) Defect yield of the equipment is in a continuous upward trend. 3) A systematic defect has occurred. When the three criteria are met, the following steps will be performed. (Step S200).

Then, a FDC (Fault Detection & Classification) analysis will be performed to at least one piece of equipment of the process. The FDC analysis is a well-known methodology in diagnosing states of the equipment; it indicates the reasons caused form the defects, and remedies for further adjusting the equipment. (Step S202). Next, at least one abnormal FDC parameter of the equipment will be found, if existed. And engineer will be alarmed to check the abnormal FDC parameter. (Step S204). Finally, at least one malfunctioning equipment part which caused the abnormal FDC parameter will be indicated by the FDC analysis. Then the engineer can repair the malfunctioning part of the equipment immediately, so that the yield reduction caused by the malfunctioning part is to be minimized.

Figure 6:
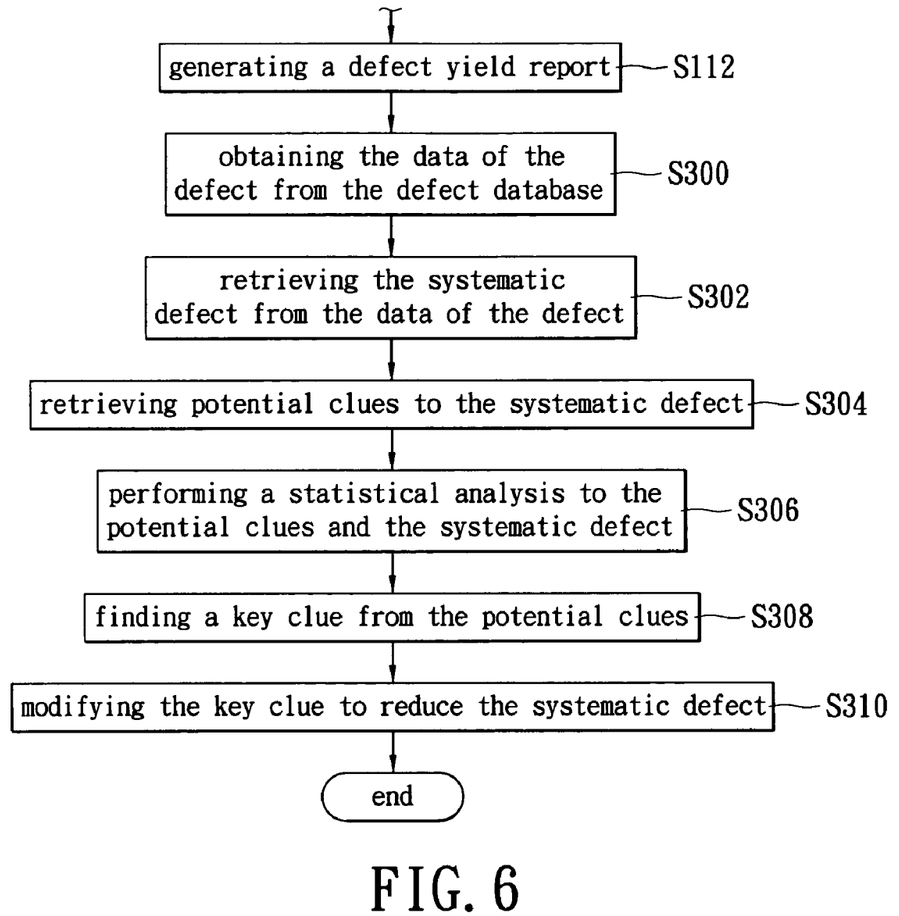
FIG. 6 is a flowchart of a third embodiment of the method for defect diagnosis and management according to the present invention.

Please refer to FIG. 6; the method of this invention has a third embodiment, which further integrates with the improvement of systematic defect. The system defect usually has severe influence on the yield; the method of the third embodiment may efficiently deal with a systematic defect. The detailed workflow of the method is set out as below, which is continued after Step S112.

Firstly, the data of the defect from the defect database will be obtained. (Step S300). Then, the systematic defect will be retrieved from the data of the defect (Step S302). Next, a plurality of potential clues corresponding to the systematic defect will be retrieved. The potential clues are possible causes of what may generate the systematic defect; they comprise the design layout, sequence of the process (logic operation), optical proximity correction, or process in-line data. (Step S304). Further, a statistical analysis will be performed after the potential clues corresponding to the systematic defect are obtained, so that the relations between potential clues and the systematic defect can therefore be found. (Step S306).

The next step is to find at least one key clue from the potential clues. The key clue contains information about what substantially influences the systematic defect, ex. line width of the conductive regions of design layout, or FDC parameters of the equipment. (Step S308). Finally, when the key clue is known, the process can be modified to reduce the systematic defect. Usually, there are two approaches: 1) Modifying the design layout; 2) Modifying parameters of the process. (Step S310). Via above mentioned steps S300 to S310, the systematic defect of the article, i.e. wafer, in the next run of the fabrication process will be reduced.

Figure 7:
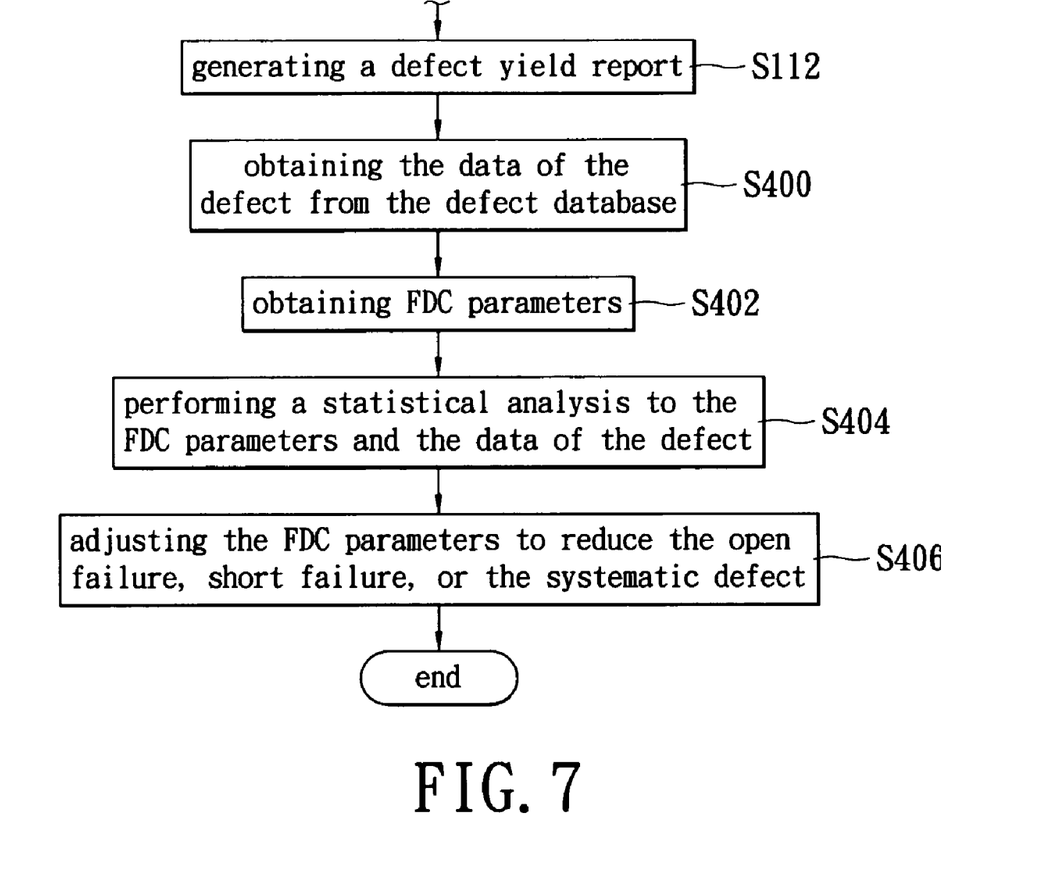
FIG. 7 is a flowchart of a fourth embodiment of the method for defect diagnosis and management according to the present invention.

Please refer to FIG. 7; the method of this invention has a fourth embodiment, which further integrates with the improvement of FDC parameters of the equipment. The detailed workflow of the method is set out as below, which is continued after Step S112.

Firstly, the data of the defect from the defect database will be obtained. (Step S400). Then, a plurality of FDC parameters of the equipment will be also obtained. The FDC parameters originate from the preceding FDC analysis, and are related to the data of the defect. (Step S402). Next, a statistical analysis will be performed to the FDC parameters and data of the defect. Some FDC parameters that are highly correlated to the open failure, short failure, or systematic defect can be found. (Step S404). Finally, when the relations between the FDC parameters and data of the defect have been known, the FDC parameters will be adjusted or modified to better ones to reduce the open failure, short failure, or the systematic defect in the next run of the fabrication process. (Step S406).

In wafer fabrication, the costs of the fabricating process are determined by many factors, the cost of equipment parts being one of them. There are many factors to determine costs of the equipment parts, ex. frequency of replacement, purchasing price. Some equipment parts are cheap, but have high possibilities to cause the failures of the wafer, i.e. high yield reduction. Therefore, the overall costs of the equipment parts are not cheap as expected. Therefore, there is a need to consider the cost of the equipment part in combination with its induced yield reduction.

Figure 8:
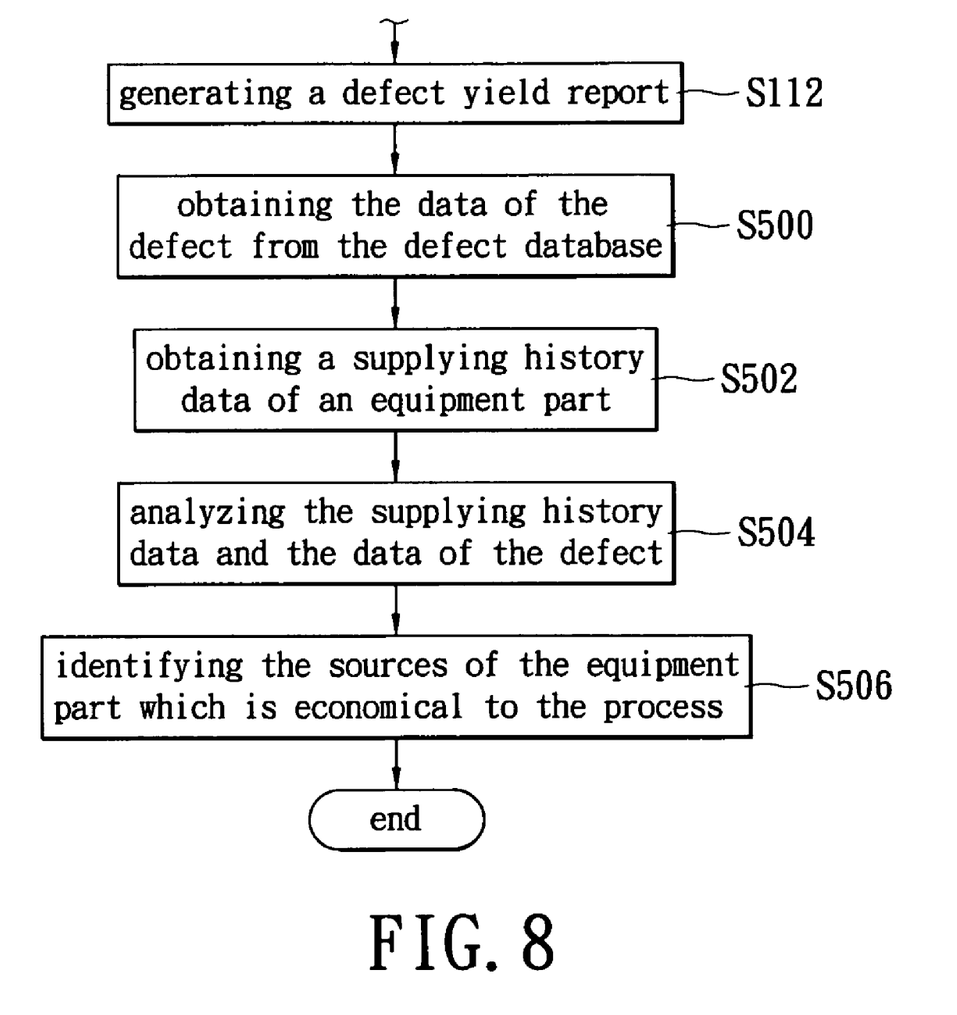
FIG. 8 is a flowchart of a fifth embodiment of the method for defect diagnosis and management according to the present invention.

Please refer to FIG. 8; the method of this invention has a fifth embodiment, which further integrates with the supplying management of the equipment part. The detailed workflow of the method is set out as below, which is continued after Step S112.

Firstly, the data of the defect from the defect database will be obtained. (Step S500). Then, a supplying history data of at least one equipment part will be obtained. The supplying history data contains information of different sources of the equipment part, to be more specific, the information comprises the frequency of replacement, purchasing price, purchasing date, or vendor, etc. (Step S502). Next, the supplying history data and the data of the defect will be analyzing to find the yield reduction to the different source of the equipment part. (Step S504). Finally, the sources of the equipment part regarding to which are more economical to the process will be identified by considering in combination with their purchasing price, the frequency of replacement, and the yield reduction. (Step S506). The engineer can realize which source is economical and high quality, and which source has high possibilities to cause failures.

Figure 9:
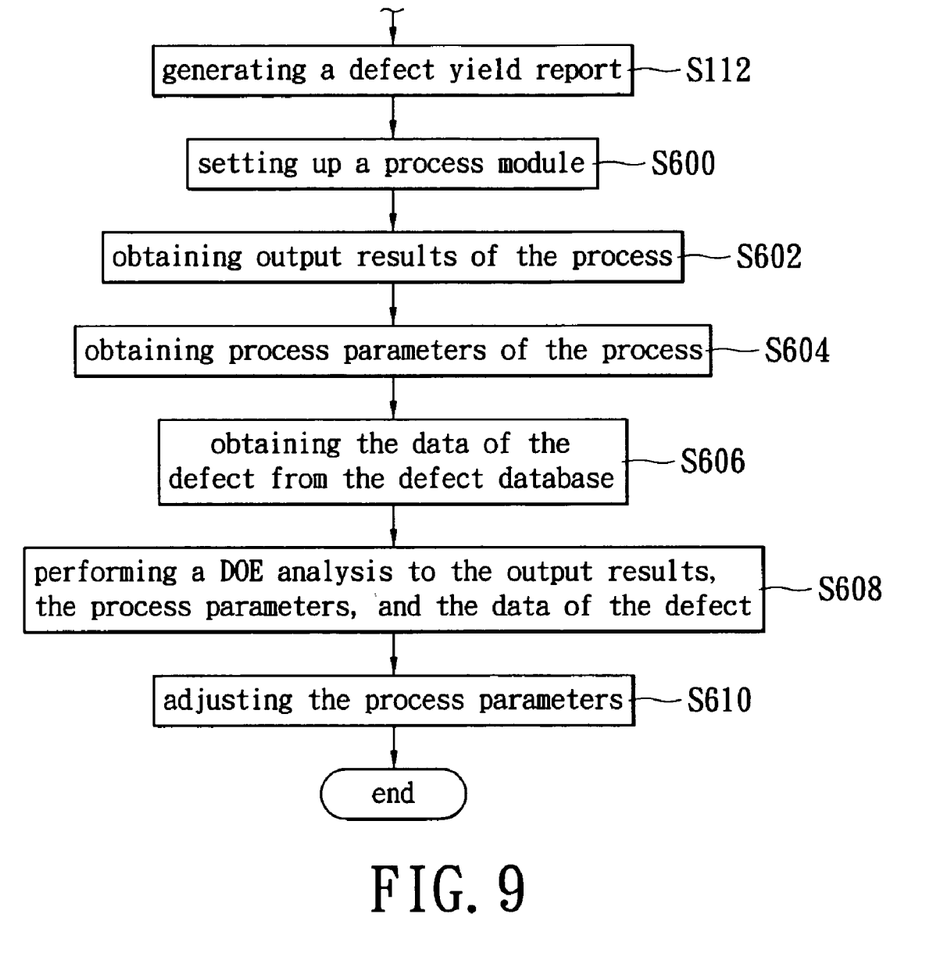
FIG. 9 is a flowchart of a sixth embodiment of the method for defect diagnosis and management according to the present invention.

Please refer to FIG. 9, the method of this invention has a sixth embodiment, which further integrates with a Design of Experiment (DOE) analysis. The detailed workflow of the method is set out as below, which is continued after Step S112.

Firstly, engineer sets up a process module of the DOE; the process module includes the full process, or parts of process. (Step S600). Then, a plurality of output results of the process will be obtained. (Step S602). A plurality of process parameters of the process will be also obtained. The process parameters include the FDC parameters of the equipment, and other parameter influencing the output results. (Step S604). Then, the data of the defect from the defect database will be obtained. (Step S606). Next, the DOE analysis will be performed in combination with the output result, the process parameters, and the data of the defect, so that the influence of the process parameters to the output results and data of the defect can be determined. (Step S608). Finally, after the DOE analysis, the process parameters will be adjusted to better ones, so as to achieve a better condition between the output results and yield reduction induced by the defect 11, 12, or 13. (Step S610).

In summary, the method according to the present invention provides the following effects:

1. The defect 11, 12, or 13 of the inspection image 10 can be judged as an open failure, a short failure, and judged as a random defect or a systematic defect.
2. The defect 11, 12, or 13 of the inspection image 10 is reviewed and judged automatically in a small period of time, so every defect generated in the process can be reviewed and judged, which ensures no potential failure will be ignored.
3. The data of the defect can be integrated with the maintenance of the equipment, finding the abnormal FDC parameter and repairing it immediately.
4. The data of the defect can be integrated with the improvement of the process, modifying the FDC parameters, or design layout, etc. to reduce the defect yield.
5. The data of the defect can be integrated with the supplying management of the equipment parts, finding the economical and quality source of the equipment part.
6. The data of the defect can be integrated with the DOE analysis, finding the better process parameters to the output results and defect yield.
7. The method of this invention can be applied in many industries, like the semiconductor, PC circuit board, mask, flat panel display, and solar cell.
8. The method of this invention can be applied against any geometry or technology level.
9. The design layout 20, the FDC parameters, the malfunctioning part, and the process parameters corresponding to the data of the defect can be collected to form a defect knowledge management (KM); a quick reference review is available for quick diagnosing and tracking the defect.

Nevertheless, the aforementioned illustrations simply set out the preferred embodiments of the present invention, without any intention to restrict the scope of the present invention to be legally protected thereto. All modifications or changes made equivalently in effect by means of using the present specification and appended drawings thereof should be thus deemed as reasonably encompassed by the asserted scope of the present invention delineated in the subsequent claims.

What is claimed is:

1. A method for defect diagnosis and management, which is implemented in a process for fabricating an article, comprising the following steps:

obtaining an inspection image of the article from a inspection tool, wherein the inspection image shows at least one defect of the article;

retrieving a design layout corresponding to the inspection image from a design database, wherein the design layout has a plurality of conductive regions;

matching the inspection image and the design layout for correcting the coordinates of the defect on the design layout from the inspection tool; and determining the overlaps of the conductive regions so as to obtain a short failure from the inspection tool if the defect covers two conductive regions, obtain a open failure from the inspection tool if the defect intercepts one of conductive region, or obtain no failure from the inspection tool if the defect overlaps one of conductive region but not intercepts or covers another conductive region.

2. The method for defect diagnosis and management according to claim 1, further comprising the step of:
   identifying whether the defect is a systematic defect or a random defect, wherein the random defect come from the adhesion of a foreign particle and the systematic defect come from unexpectedly varying size of a fabricated pattern.

3. The method for defect diagnosis and management according to claim 2, further comprising repeating the steps with different inspection images.

4. The method for defect diagnosis and management according to claim 3, further comprising the steps of:
   collecting data of the defect to form a defect database, wherein the defect database combines to the maintenance of equipment, improvement of the process, and design of experiment; and
   generating a defect yield report.

5. The method for defect diagnosis and management according to claim 4, further comprising the steps of:
   obtaining the data of the defect from the defect database;
   identifying whether at least one equipment is prone to be maintained based on one of the criteria: (a) defect yield of the equipment being out of specified or controlled limit, (b) defect yield of the equipment being in a continuous upward trend, and (c) a systematic defect being occurred;
   performing a FDC (Fault detection & classification) analysis to at least one equipment of the process;
   finding at least one abnormal FDC parameter of the equipment; and
   repairing at least one malfunctioning equipment part which causes the abnormal FDC parameter.

6. The method for defect diagnosis and management according to claim 4, further comprising the steps of:
   obtaining the data of the defect from the defect database;
   retrieving the systematic defect from the data of the defect;
   retrieving a plurality of potential clues corresponding to the systematic defect;
   performing a statistical analysis to the potential clues and the systematic defect;
   finding at least one key clue from the potential clues which substantially influence the systematic defect; and
   modifying the key clue to reduce the systematic defect.

7. The method for defect diagnosis and management according to claim 6, wherein the potential clues comprise: the design layout, sequence of the process, optical proximity correction, or process in-line data.

8. The method for defect diagnosis and management according to claim 4, further comprising the steps of:
   obtaining the data of the defect from the defect database;
   obtaining a plurality of FDC parameters;
   performing a statistical analysis to the FDC parameters and the data of the defect;
   correlating the FDC parameters to the open failure, short failure or the systematic defect; and
   adjusting the FDC parameters to reduce the open failure, the short failure, or the systematic defect.

9. The method for defect diagnosis and management according to claim 4, further comprising the steps of:
   obtaining the data of the defect from the defect database;
   obtaining a supplying history data of at least one equipment part containing information of different sources of the equipment part;
   analyzing the supplying history data and the data of the defect to find the yield reduction of different sources of the equipment part; and
   identifying the sources of the equipment part which is economical to the process.

10. The method for defect diagnosis and management according to claim 9, wherein the information comprises: frequency of replacement, and purchasing price.

11. The method for defect diagnosis and management according to claim 4, further comprising the steps of:
    obtaining a plurality of output results of the process;
    obtaining a plurality of process parameters of the process;
    obtaining the data of the defect from the defect database;
    performing a Design of Experiment (DOE) analysis to the output results, the process parameters, and the data of the defect; and
    adjusting the process parameters.

12. The method for defect diagnosis and management according to claim 11, wherein the process parameters comprise: a plurality of FDC parameters of the process.

13. The method for defect diagnosis and management according to claim 1, wherein the article comprises semiconductor, PC circuit board, mask, flat panel display or solar cell.

* * * * *